United States Patent [19]

Berdan et al.

[11] 4,169,018

[45] Sep. 25, 1979

[54] PROCESS FOR ELECTROFORMING COPPER FOIL

[75] Inventors: Betty L. Berdan; Betty M. Luce, both of Willowick, Ohio

[73] Assignee: Gould Inc., Rolling Meadows, Ill.

[21] Appl. No.: 869,687

[22] Filed: Jan. 16, 1978

[51] Int. Cl.$^2$ .............................................. C25D 1/04
[52] U.S. Cl. ....................................... 204/13; 204/28; 204/33; 204/52 R
[58] Field of Search .................. 204/12, 13, 28, 52 R, 204/33, 38 B; 156/151

[56] References Cited

U.S. PATENT DOCUMENTS

| | | | |
|---|---|---|---|
| 2,871,172 | 1/1959 | Atkinson | 204/52 R |
| 2,882,209 | 4/1959 | Brown | 204/52 R |
| 3,634,205 | 1/1972 | Melillo | 204/52 R |
| 3,969,199 | 7/1976 | Berdan | 204/33 |
| 3,990,926 | 11/1976 | Konicek | 156/151 |
| 3,998,601 | 12/1976 | Yates | 204/12 |

*Primary Examiner*—John H. Mack
*Assistant Examiner*—William Leader
*Attorney, Agent, or Firm*—Russell E. Baumann; Edward E. Sachs

[57] ABSTRACT

An improved copper electroplating method typically for use on a carrier material such as aluminum is provided by pretreating of the carrier surface and electrodepositing copper foil utilizing a single-step copper plating process comprising an acidic plating bath containing copper, nitrate, and fluoride ions which can be operated at a single-current density.

13 Claims, No Drawings

PROCESS FOR ELECTROFORMING COPPER FOIL

BACKGROUND OF THE INVENTION

This present invention relates to the art of electroplating and more particularly to a method for producing electrodeposits of a thin layer of copper particularly useful for material in printed circuits.

This invention is particularly applicable to the formation of ultra-thin electrodeposited foils of copper on an aluminum carrier and will be primarily described in that context, but it is not intended in any way to be limited to foils of copper on an aluminum carrier. These foils may have a thickness on the order of 5 to 18.0 microns and are typically deposited on an aluminum sheet of 50 to 75 microns. For the purposes of this disclosure, the term aluminum is intended to embrace the commercially pure metal as well as alloys of the metal which are predominantly aluminum.

A well-known technique for manufacturing printed circuit boards involves depositing copper on a temporary carrier such as a sheet of aluminum, applying the exposed surface of the copper to a printed circuit board, such as an epoxy resin impregnated fiber glass mat or substrate, bonding the copper surface to the epoxy resin through the use of heat and pressure, and then removing the temporary carrier. In order for this laminate of thin copper foil on the resinous substrate to yield a quality printed circuit board, among other properties the thin foil must be highly pore-free and securely bondable to the substrate. In the prior art, as first disclosed in U.S. Pat. No. 3,293,109 and later adapted in U.S. Pat. No. 3,990,926, a two or more step electrodeposition of copper had been necessary to produce a foil highly pore-free and securely bondable to the resinous substrate. Typically, this involves a first copper electroplate to build up a thickness of up to about 50 microinches to ensure a uniform copper substrate base and then at least one more bath and/or a different current density to provide the greater thickness buildup as needed and to nodularize the outer copper surface for increasing the bond strength between the foil and the substrate to which it is bonded or laminated. That is, a multi-step process of electroplating copper has been needed to yield a highly pore-free foil which is securely bondable to the resinous substrate or, in other terms has a high "peel strength." "Peel strength" is a conventionally used term to refer to the strength of the bond between the foil and the resinous substrate. Peel strength in excess of about 7 lbs./in., according to the standardized measuring method ASTM D/1867 is generally deemed necessary to satisfy printed circuit requirements.

The multi-step process although capable of producing pore-free foil with a nodularized outer surface does have the drawback of requiring close control and regulation between the steps. Not only does each step need careful monitoring but also process variables of each step such as bath composition, current density in the bath, temperature, etc., must be carefully coordinated with those of each other step. For example, if a two-step process is used in which the bath composition is changed in the second step, close coordination is needed between bath composition and other variables in the first step with the new bath composition of the second step. These control and coordination requirements do not yield a simple process. Even with careful control of this multi-step process, its complexity often gives rise to reliability problems. Additionally, the multiplicity of steps would give rise to the need for more space and equipment and corresponding expense associated with them.

Accordingly, it is an object of the present invention to provide an improved process of electroplating foil.

Another object of the present invention is to provide a one-step copper electroplating process which yields a uniform, virtually pore-free copper ultra-thin foil with a nodularized surface for strong adherence to an epoxy resin impregnated fiber glass circuit board.

Yet another object of the present invention is to provide a bath which increases initial copper nucleation and provides a nodularized outer surface.

Yet another object of the present invention is to provide an improved process for electrodeposition of copper on a carrier.

Yet still another object of the present invention is to provide an improved process for electroplating pore-free copper on an aluminum carrier with a nodularized surface for strong adherence to an epoxy resin impregnated fiber glass circuit board.

Other objects and advantages of the present invention will become apparent from the following detailed description thereof, which includes the best mode contemplated for practicing the invention.

SUMMARY OF THE INVENTION

Broadly, the present invention concerns the provision of a process for electroplating copper in one single step which provides a highly pore-free ultra-thin foil with a nodularized outer surface.

In one aspect, the present invention concerns a bath for electroplating ultra-thin copper foil which increases initial copper nucleation for pore-free foil and provides a nodularized outer surface.

In another aspect, the present invention involves a process particularly suitable for providing highly pore-free, ultra-thin foil with a nodularized surface for strong adhesion to a printed circuit board by electroplating cooper, in a single step in an acidic bath with copper, nitrate and fluoride ions in which the current density in the bath can remain at a constant, predetermined value. This process is typically performed on a carrier material such as aluminum.

More specifically, the aluminum carrier is cleaned, etched in a caustic solution, rinsed and then pretreated with an alkaline, aqueous alkali metal zincate solution containing one or more water soluble salts selected from the group consisting of iron, cobalt and nickel salts. This coating is then substantially entirely removed by treating it with acid yielding a uniform thin oxide parting layer on the aluminum. This parting layer as is more fully explained in U.S. Pat. No. 3,969,199, assigned to the assignee of the above application, and incorporated herein by reference provides an aluminum surface suitable for uniform high density copper nucleation during copper electrodeposition.

The pretreated aluminum carrier is then fed into a copper sulfate bath containing nitrates and fluoride ions soluble in the solution such as sodium fluoride, calcium fluoride, potassium fluoride or ammonium fluoride. The bath is operated at a constant, predetermined current density with its composition remaining unchanged. The presence of the nitrates in the bath helps promote nodularization to yield the desired peel strength. The presence of the fluoride ion greatly increases the initial copper nucleation greatly surpassing the effect of the zincate pretreatment alone. Since the metal atoms of copper are not deposited as a continuous film but rather start at "favored sites" and spread laterally until a continuous film is formed, it is highly desirable to initially provide a large number of nucleation centers. This is especially important in plating thin films in order to produce a highly pore-free foil. An ultra-thin copper foil is formed on the carrier by the single-step process which is pore free and has a nodularized surface for strong adhesion to a printed circuit board.

DETAILED DESCRIPTION OF THE INVENTION

A copper plating bath useful in the practice of the present invention is generally formed by admixing an acidic plating solution containing copper ions, nitrate ions for nodularizing the outer surface of the plated copper and a nucleating ingredient for increasing nucleation. The temperature of the plating solution typically being from 22° to 50° C. The use of this bath operated at a cathodic current density of a constant, predetermined value provides a process for single-step plating of ultra-thin copper foil that is pore-free and has a nodularized surface for good adhesion when used for printed circuit applications as will be more fully explained below.

More particularly a novel copper plating bath which allows for single-step plating is formed by admixing an acidic plating solution preferably having a pH of less than 2 containing copper ions in a concentration of from 10 to 70 grams/liter, nitrate ions in a concentration of from 3 to 50 grams/liter, and fluoride ions in a concentration from ¼ to 10 grams/liter. The temperature of the plating solution typically being from 22° to 50° C.

In accordance with this invention the electroplating of the copper to produce a pore-free, ultra-thin copper foil with a nodularized surface is done in a plating solution in which the composition of the solution is not changed and that can be operated at a cathodic current density of a constant predetermined value. That is, unlike previous prior art processes the composition of the plating solution and/or current density level need not be changed to produce the virtually pore-free, ultra-thin copper foil with a nodularized outer surface.

One particular application of the method according to the invention is the plating and nodularization of a very thin printed circuit grade copper foil, that is copper foil having a thickness of between 5 and 18 microns, or even less. Such foil is often deposited on a temporary carrier such as aluminum, for example aluminum foil and ultimately removed from the carrier after the copper foil has been bonded to a permanent substrate in the manufacture of a printed circuit board. Other typical temporary carriers are copper, iron and nickel.

The copper foil needs to be virtually pore-free even at these very thin gauges and have an acceptable peel strength when laminated to a resinous substrate in the production of printed circuit boards. The single-step copper plating method of the present invention enables the production of a material which is pore-free with acceptable peel strength when laminated.

The method of the present invention relies for its efficacy on the incorporation of nitrate ions and a nucleating ingredient for increasing nucleation in an acidic copper plating solution, and then cathodically electroplating copper foil. Both the composition of the plating solution and the cathode current density remain unchanged during the electroplating while still producing virtually pore-free foil with nodules on the surface.

In general, the plating solution will contain copper sulphate or copper fluoborate, for example, copper sulphate pentahydrate; sulphuric acid; a soluble nitrate salt such as copper nitrate; and a soluble fluoride salt such as sodium fluoride.

The method of the invention may be performed with the composition of the copper plating bath falling within a broad range of proportions and the operating conditions likewise being selectable from a broad range as set forth in Tables I and II below. It is to be noted, however, once the composition of the bath and the cathode current density is determined, the electroplating of copper foil can be performed in a single step without varying bath composition or current density.

TABLE I

| Ingredient | Operative Range Grams/Liter | Preferred Range Grams/Liter |
| --- | --- | --- |
| Copper (as copper sulphate or copper fluoborate) | 10–70 | 30–45 |
| Sulphuric or Fluoboric Acid | 25–200 | 45–65 |
| Nitrate (as copper nitrate, ammonium nitrate, potassium nitrate, sodium nitrate, or nitric acid) | 3–50 | 15–30 |
| Fluoride (as sodium fluoride, calcium fluoride, potassium fluoride, ammonium fluoride, lithium fluoride, or hydrofluoric acid) | 0.05–10 | 0.25–2 |

TABLE II

| Condition | Board Range | Preferred Range |
| --- | --- | --- |
| Cathode current density (amperes/foot$^2$) | 50–300 | 60–200 |
| Time (seconds) | 10–400 | 100–250 |
| Temperature (degrees Celsius) | 22–50 | 24–28 |
| Anode | Copper | Copper |

The concentration of copper, nitrate and fluoride ions in the solution, the degree of agitation of the solutions, the temperature of the solutions and the treatment time all contribute to establishing critical minimum and critical maximum current densities. Thus, for example raising the temperature of a given solution or agitating the solution tends to raise the critical minimum current density. Lowering the copper, nitrate, or fluoride-ion concentration in a plating solution lowers the maximum critical current density.

In order that the invention may be more fully understood, the following examples are given by way of illustration:

EXAMPLE 1

A continuous 2 mil strip of commercially available aluminum, such as Aluminum Association of America designation 1100 or 3003, was first passed through a caustic solution etch.

The etching composition used contained from about 1.5 to 2.5 weight percent sodium hydroxide in admixture with sodium gluconate (a sequestering agent to allow aluminum to stay in a solution at relatively high concentrations) and a wetting agent such as sodium lauryl sulfate. The etchant composition was maintained at room temperature with a foil line speed of 2 feet/minute which provided 2 minute contact time with the etchant.

The material strip was secondly run through ambient temperature tap water rinse as quickly as possible to stop the reaction from continuing to take place. Then the strip was passed through a zincate immersion bath. The bath used contained 50 grams/liter sodium hydroxide in admixture with 5 grams/liter of zinc oxide, 1 grams/liter ferric chloride, 1 grams/liter nickel chloride, 1 grams/liter sodium nitrate and 50 grams/liter Rochelle salt. The bath was operated at room temperature and dwell time of the strip in the bath was 20 seconds. The material strip was next rinsed in tap water and then run through 2.5 weight percent by volume nitric acid bath with a dwell time in solution of 1 minute. After the acid bath the strip was rinsed again leaving a chemically clean parting layer on the surface of the aluminum to allow for peelability between the foil and the aluminum.

Lastly, the strip was run through the copper electroplating bath which contained 50 grams/liter of sulphuric acid in admixture with 40 grams/liter of copper, as copper sulphate, 25 grams/liter ammonium nitrate and 2 grams/liter sodium fluoride. The bath was operated at room temperature at a cathode current density of 100 amperes/foot$^2$ and a dwell time in solution of 190 seconds yielding 7 microns thick foil.

EXAMPLE 2

Example 1 was repeated except the 2 grams/liter of sodium fluoride in the copper electroplating bath was replaced with 2 grams/liter of potassium fluoride.

EXAMPLE 3

Example 1 was repeated except the 50 grams/liter of sulphuric acid was replaced with 50 grams/liter of fluoboric acid and the 40 grams/liter of copper as copper sulphate was replaced with 40 grams/liter of copper as copper fluoborate in the copper electroplating bath.

EXAMPLE 4

Example 1 was repeated except the copper electroplating bath contained 60 grams/liter of sulphuric acid in admixture with 35 grams/liter of copper as copper sulphate, 20 grams/liter copper nitrate and 2 grams/liter of sodium fluoride. The bath was operated at room temperature at a cathode current density of 80 amperes/foot$^2$ and a dwell time in solution of 240 seconds yielding 7 micron thick foil.

EXAMPLE 5

Example 4 was repeated except the cathode current density of 80 amperes/foot$^2$ and dwell time in solution of 230 seconds for the copper electroplating bath were replaced with a cathode current density of 60 amperes/foot$^2$ for 300 seconds for 7 micron thick foil.

EXAMPLE 6

A continuous 2 mil strip of commercially available nickel was chemically cleaned and provided with a parting layer as is known in the art, for example, as is described in *Electroforming* by Peter Spiro, Robert Draper Ltd., 1967, pages 83-87.

The strip was then run through the copper electroplating bath with a combined 50 grams/liter of sulphuric acid in admixture with 45 grams/liter of copper as copper sulphate, 25 grams/liter of potassium nitrate and 1.5 grams/liter of potassium fluoride. The bath was operated at room temperature at a cathode current density of 100 amperes/foot$^2$. The dwell time in solution was varied to yield different thicknesses of foil on the nickel.

EXAMPLE 7

Example 6 was repeated except the nickel carrier strip was replaced with a commercially available copper strip in which a parting layer as is known in the art was provided.

Accordingly, all of the above examples provide for pore-free copper foil which is easily mechanically strippable from a carrier and has good peel strength when laminated such as for printed circuit applications. The copper plating is performed in a single-step plating process which can be operated at a single-current density. The plating process provides various advantageous results heretofore not obtainable.

In view of the above, it will be seen that the several objects of the invention are achieved and other advantageous results attained.

As various changes could be made in the above methods without departing from the scope of the invention, it is intended that all matter contained in the above description shall be interpreted as illustrative and not in a limiting sense.

What is claimed is:

1. A process for electroforming a thin nodularized copper foil which is virtually pore free for use in printed circuits comprising the steps of:
   providing a single, preselected composition copper plating bath having nitrate ions in the concentration of between 3 and 50 grams/liter for promoting nodularizing of the outer surface of the foil;
   adding a fluoride ion in the concentration of between 0.05 and 10 grams/liter to said bath for increasing nucleation; and
   operating said bath at a constant predetermined cathode current density of between 50 and 300 amperes/foot$^2$ thereby providing a one-step method.

2. A process for electroforming copper foil on a carrier material in which said foil is virtually pore free and has a nodularized outer surface comprising the steps of:
   providing said carrier material with a parting layer to allow for peelability between said copper foil and the carrier material;
   passing said carrier material through a single preselected composition copper plating bath having nitrate ions in the concentration of between 3 and 50 grams/liter and fluoride ions in the concentration of between 0.05 and 10 grams/liter; and
   operating said bath at a constant predetermined cathode current density of between 50 and 300 amperes/foot$^2$ thereby providing a one-step process.

3. The process of claim 2 wherein said copper bath has copper ions in a concentration of between 10 and 70 grams/liter.

4. The process of claim 3 wherein said copper bath comprises an acid selected from the group consisting of sulphuric acid and fluoboric acid yielding a pH of less than 2.

5. The process of claim 4 wherein said fluoride-ion concentration is provided by a compound selected from the group consisting of sodium fluoride, calcium fluoride, potassium fluoride, ammonium fluoride, lithium fluoride and hydrofluoric acid.

6. The process of claim 5 further including maintaining said bath at a single preselected temperature between 22° and 50° C.

7. The process of claim 5 wherein said carrier material is selected by the group consisting of aluminum, nickel, iron and copper.

8. An electrodeposited foil according to the process as described by claim 2.

9. A process for electroforming thin copper foil on aluminum carrier material for use in printed circuits in which said foil is virtually pore free and has a nodularized outer surface comprising;

providing a continuous strip of aluminum material;

etching said aluminum material and rinsing said etched aluminum material in water;

passing said material through a zincate immersion bath and rinsing said material in water;

passing said material through a nitric acid bath and rinsing said material in water;

passing said carrier material through a single preselected composition copper plating bath having nitrate ions in the concentration of between 3 and 30 grams/liter and fluoride ions in the concentration of between 0.05 and 10 grams/liter; and operating said bath at a constant, predetermined cathode current density of between 50 and 300 amperes/foot$^2$ thereby providing a one-step process.

10. The process of claim 9 wherein said copper bath has copper ions in a concentration of between 10 and 70 grams/liter.

11. The process of claim 10 wherein said copper bath comprises an acid selected from the group consisting of sulphuric acid and fluoboric acid yielding a pH of less than 2.

12. The process of claim 11 wherein said fluoride-ion concentration is provided by a compound selected from the group consisting of sodium fluoride, calcium fluoride, potassium fluoride, ammonium fluoride, lithium fluoride, and hydrofluoric acid.

13. The process of claim 12 further including maintaining said bath at a single preselected temperature between 22° and 50° C.

* * * * *